US008416109B2

(12) United States Patent  
Kirichenko

(10) Patent No.: US 8,416,109 B2  
(45) Date of Patent: Apr. 9, 2013

(54) SUPERCONDUCTING ANALOG-TO-DIGITAL CONVERTER WITH CURRENT AMPLIFIED FEEDBACK

(75) Inventor: Dmitri Kirichenko, Yorktown Heights, NY (US)

(73) Assignee: HYPRES, Inc., Elmsford, NY (US)

( * ) Notice: Subject to any disclaimer, the term of this patent is extended or adjusted under 35 U.S.C. 154(b) by 217 days.

(21) Appl. No.: 12/969,936

(22) Filed: Dec. 16, 2010

(65) Prior Publication Data

US 2012/0274494 A1    Nov. 1, 2012

(51) Int. Cl.  
*H03M 1/00* (2006.01)

(52) U.S. Cl. .................... 341/133; 341/155; 341/143

(58) Field of Classification Search .................. 341/133, 341/143, 155, 120, 118, 117, 171  
See application file for complete search history.

(56) References Cited

U.S. PATENT DOCUMENTS

| | | | | |
|---|---|---|---|---|
| 4,315,255 A | * | 2/1982 | Harris et al. | 341/171 |
| 4,902,908 A | * | 2/1990 | Harada | 327/367 |
| 5,140,324 A | | 8/1992 | Przybysz | 341/133 |
| 5,341,136 A | | 8/1994 | Przybysz | 341/133 |
| 5,351,049 A | | 9/1994 | Lee | 341/133 |
| 5,400,026 A | | 3/1995 | Bradley | 341/133 |
| 6,157,329 A | | 12/2000 | Lee | 341/133 |
| 6,816,103 B2 | | 11/2004 | Jonsson | 341/160 |
| 7,002,504 B2 | | 2/2006 | McMahill | 341/161 |
| 7,038,604 B2 | | 5/2006 | Hirano | 341/133 |
| 7,057,541 B1 | | 6/2006 | Kaplan | 341/143 |
| 7,598,897 B2 | | 10/2009 | Kirichenko | 341/143 |
| 7,728,748 B1 | | 6/2010 | Kirichenko | 341/133 |

OTHER PUBLICATIONS

Yoshida et al, "Josephson analog amplifier with larger current gain", IEEE Trans Magnet vol. MAG-23, No. 2, pp. 723-726 (1987).  
N. F. Pedersen "Fluxon Electronic Devices" IEEE Transactions on Magnetics, vol. 27, No. 2, (1991).  
J. E. Nordman, "Superconductive amplifying devices using fluxon dynamics", Supercond Sci & Technol 8 pp. 681-699 (1995).  
"Superconductor Analog-to-Digital Converters" O. Mukhanov, et al., Proc. IEEE, vol. 92, pp. 1564-1584 (2004).  
"Inductive Isolation in Stacked SQUID Amplifiers" Q. P. Herr IEEE Transactions on Applied Superconductivity, vol. 17, pp. 565-568, (2007).  
"High Performance, All Digital RF Receiver Tested at 7.5 GigaHertz" Wong, Jack;Kirichenko, Dmitri; et al. Military Communications Conference, 2007. MILCOM 2007. IEEE, Oct. 29-31, 2007 pp. 1-5, Digital Object Identifier 10.1109/MILCOM.2007.4455052.  
Nagatsuma et al, "Flux-Flow-Type Josephson Linear Amplifier with Large Gain and Wide Linear Range" Jpn. J. Appl. Phys. vol. 24 pp. L599-L601 (1985).

\* cited by examiner

*Primary Examiner* — Jean B Jeanglaude  
(74) *Attorney, Agent, or Firm* — George Sai-Halasz

(57) ABSTRACT

A superconducting bandpass sigma-delta modulator and a method for analog-to-digital signal conversion is disclosed. The superconducting bandpass sigma-delta modulator includes coupled resonators having a desired impedance ratio. A first resonator connects to a comparator, which comparator generates single-flux-quantum pulses. A feedback loop links from the comparator to a second resonator and includes a current amplifier. A digital RF receiver system is also disclosed. This system includes a second order bandpass sigma-delta modulator, which has a desired impedance ratio between resonators and a feedback loop with current amplification. The system further has an antenna configured to receive a GHz frequency radio transmission and to yield an analog signal which is accepted by the sigma-delta modulator.

22 Claims, 4 Drawing Sheets

SUPERCONDUCTING ANALOG-TO-DIGITAL CONVERTER WITH CURRENT AMPLIFIED FEEDBACK

GOVERNMENT INTEREST

This invention was made with U.S. Government support under Small Business Innovation Research Contract W15P7T-07-C-A-001, awarded by the U.S. Army. The U.S. Government has certain rights in this invention.

BACKGROUND

The present invention relates to superconducting electronics. In particular, it relates to Analog-to-Digital Converters (ADC) based on oversampled single-bit quantizers.

BRIEF SUMMARY

A superconducting bandpass sigma-delta modulator and a method for analog-to-digital signal conversion are disclosed. The superconducting bandpass sigma-delta modulator includes a first and a second coupled resonators having a desired impedance ratio. The first resonator connects to a comparator, which comparator generates single-flux-quantum pulses. A feedback loop forms a link from the comparator to the second resonator, and this link includes a current amplifier.

A digital radio frequency receiver system is also disclosed. This system includes a second order bandpass sigma-delta modulator, which has a first and a second resonator coupled to each other, and the resonators have a desired impedance ratio. The first resonator connects to a comparator, which comparator generates single-flux-quantum pulses. A feedback loop forms a link from the comparator to the second resonator, and this link includes a current amplifier. The system further includes an antenna configured to receive a GHz frequency radio transmission and to yield an analog signal which is accepted by the sigma-delta modulator.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
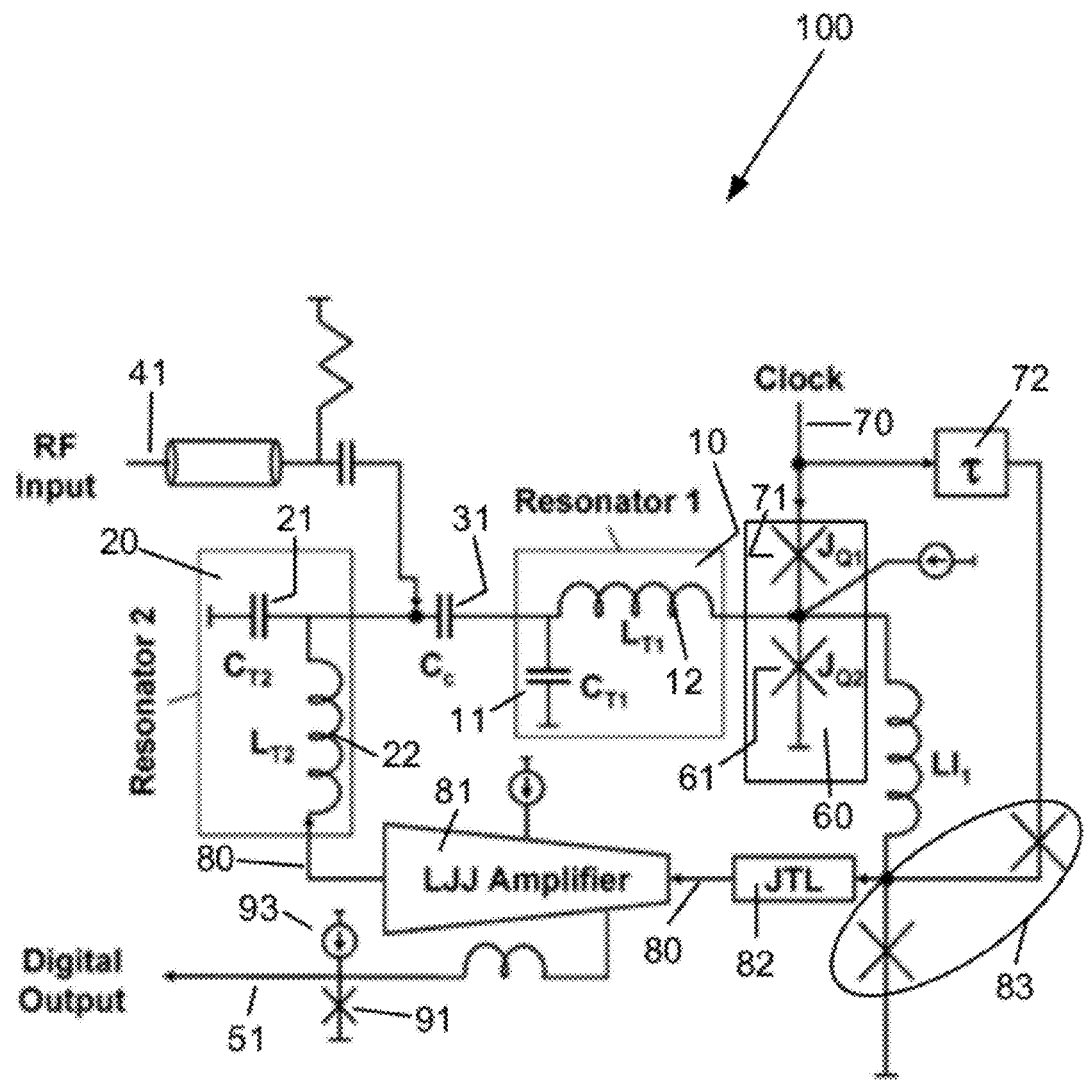
FIG. 1 shows a schematic circuit diagram of a superconducting second order bandpass sigma-delta modulator according to an embodiment of the present invention.

It is understood that analog-to-digital converters (ADC) based on sigma-delta ($\Sigma\Delta$) modulators, or delta-sigma ($\Delta\Sigma$) modulators, are well known in the electronic arts. Basic concepts of superconductor ADCs have also been discussed already, for instance by O. A. Mukhanov et al. in "Superconductor Analog-to-Digital Converters", Proc. IEEE, Vol. 92, pp. 1564-1584 (2004). Various implementations of multi stage superconductor bandpass $\Sigma\Delta$ modulators have also been disclosed, see US patents: U.S. Pat. No. 7,598,897, issued on Oct. 6, 2009 to D. Kirichenko, and U.S. Pat. No. 7,728,748, issued on Jun. 1, 2010 to D. Kirichenko. Aspects of these earlier implementations have also been reported at the Military Communications Conference, 2007. MILCOM 2007. IEEE, 29-31 Oct. 2007, Page(s): 1-5, Digital Object Identifier 10.1109/MILCOM.2007.4455052, by D. Kirichenko et al.

The embodiments of the present disclosure are implemented in the general framework of superconductor rapid single-flux-quantum (RSFQ) technology.

It is also understood that in RSFQ technology there are known structures and methods, for instance, input output methods, timing schemes, current and power supplies, and others, that may be symbolically displayed in the drawings of the present disclosure, but are only peripheral for the embodiments of the instant disclosure and hence will not be discussed in detail.

In embodiments of the presently disclosed $\Sigma\Delta$ modulator attention is given to minimize intrinsic timing uncertainties, also known as jitter. Improving the internal timing accuracy in the modulator leads to better performance. In embodiments of the present disclosure timing accuracy of the modulator is improved in the feedback loops, and by the manner the resonators are coupled to each other. In representative embodiments of the present disclosure resonators are connected by a passive element, such as a capacitor, and the decoupling of the resonators is achieved by creating an impedance mismatch between neighboring resonators. Such a scheme may lead to improved timing while yielding sufficient resonator isolation. In the feedback loop, the comparator output entering the feedback path is subjected to current amplification in order to satisfy requirements arising due to the resonator's impedance mismatch. The current amplification typically contains a long Josephson junction (LJJ), which is known for its timing accuracy and bandwidth linearity.

FIG. 1 shows a schematic circuit diagram of a superconducting second order bandpass $\Sigma\Delta$ modulator 100 according to an embodiment of the present invention. Being of second order, the superconducting circuit exhibits two resonators 10, 20. The first resonator's capacitor 11 is marked as $C_{T1}$, and the first resonator's inductor is 12 marked as $L_{T1}$. Similarly, the second resonator's capacitor 21 is marked as $C_{T2}$, and the second resonator's inductor 22 is marked as $L_{T2}$. The $\Sigma\Delta$ modulator 100 is constructed in such a way that the first resonator 10 and the second resonator 20 have a desired impedance ratio. The desired impedance ratio may be selected to result in a sufficiently large impedance mismatch, such that this mismatch would assure adequate isolation between the two resonators. Depending on particular details of an embodiment, such a desired impedance ratio may be between 10 and 200, but more typically between 20 and 100.

The two resonators 10, 20 are coupled to each other through a capacitor 31, marked as $C_c$ in FIG. 1. With the proper selection of the impedance ratio and of the coupling capacitor $C_c$, one may achieve proper isolation of the resonators 10, 20, together with repeatable accurate timing in every clock cycle. The good timing behavior is due to simplicity, namely to the fact that only low loss passive electrical components, such as inductors and capacitors are used in the resonators and in their coupling.

It is known in the art that the resonant frequencies of the resonators in bandpass $\Sigma\Delta$ modulators have to be quite close to one another. This conditions entails that $L_{T1} \times C_{T1} \approx L_{T2} \times C_{T2}$, from which it follows that the impedance ratio, $Z_1/Z_2$, between the first resonator 10 and the second resonator 20, is about equal to the ratio, $L_{T1}/L_{T2}$, of the first resonator's inductance 12 and the second resonator's inductance 22. Since the desired impedance ratio of the two resonators, and hence $L_{T1}/L_{T2}$, is relatively large, it may result in that the second resonator's inductance 22, $L_{T2}$, has to be selected to be rather small, possibly in the few pH range, maybe being only 1 to 2 pH.

Having a small inductance in the second resonator requires that a large current be supplied by the feedback loop 80, which current flows into the second resonator's inductance 22. In order to provide the necessary current, the feedback loop 80 includes current amplification. In representative embodiments of the invention the current amplification includes a long Josephson Junction (LJJ) 81. An LJJ comprises a Josephson junction in which at least one dimension is significantly larger than the Josephson penetration depth ($\lambda_J$), which is typically of several micrometers. Long Josephson Junctions are known in the art, see for instance, N. F. Pedersen, "Fluxon Electronic Devices," IEEE Transactions on Magnetics, vol. 27, no. 2, March 1991, pp. 3328-3334. In an LJJ, a Josephson vortex, or fluxon, may propagate as a sharp voltage pulse from the input to the output without attenuation.

The digitizing in the $\Sigma\Delta$ modulator 100 occurs in the Josephson junction comparator 60, which connects to the first resonator 10. The JJ comparator generates single-flux-quantum (SFQ) pulses. The SFQ pulses are produced by the clocked JJ 61 marked $J_{Q2}$. The comparator JJ 61, is clocked through second JJ 71, marked $J_{Q1}$. Such clocked JJ comparators are well known in the art, and they may be able to exceed pulse rates of 100 GHz.

It is also know in the art that due to the quantum nature of the JJ switching, a JJ comparator clocked through a second JJ provides a backward directed pulse simultaneously with the output of a SFQ pulse. The backward directed pulse provides an implicit feedback loop for the first resonator 10, consequently an explicit feedback loop 80 is needed only for the second resonator 20. The implicit feedback due to the backward pulse of the comparator JJ 61 has the advantage of intrinsically possessing the desired precise timing.

The explicit feedback loop 80 links to the second resonator 20 and receives the SFQ pulses of the comparator 60. Typically, the SFQ pulses may be put through a JJ delay flip-flop 83 for resynchronization ahead of amplification. Also, a variable delay 72 may be inserted into the clock signal path for additional flexibility in the feedback timing. For the explicit second-order feedback loop 80 to be effective, the feedback time of the loop may have to be less than one clock period. It is also desirable that the signal frequency and the sampling frequency to be in certain specific ratios, with the sampling frequency being 4 times the signal frequency in a representative embodiment. Such arrangements in the feedback loop as the flip flop 83, and the variable delay 72 are known in the art. There may be further techniques known in the technology for achieving improved operation that are not shown or discussed here, which nonetheless, may also be applied without limitation by embodiments of the present invention.

Following the possible resynchronization, the feedback path 80 enters the current amplification stage. Apart of the already discussed LJJ 81, which is a novel element in the feedback loop 80 and serves as the primary current amplifier, one may employ a Josephson transmission line (JTL) 82 for preamplification purposes.

The analog input signal 41, which typically, but not exclusively, may be in the 100 MHz to 100 GHz range connects to the second resonator 20. The digital output signal 51 may be tapped off the feedback path 80, typically, but not exclusively from the LJJ amplifier 81.

Embodiments of the invention may contain additional components, or fewer components, as such may be known in the art. Additional components may be, without limitation, current sources 93, latches, clocks, JJs 91, further delay elements in the feedbacks, and others.

Figure 2A:
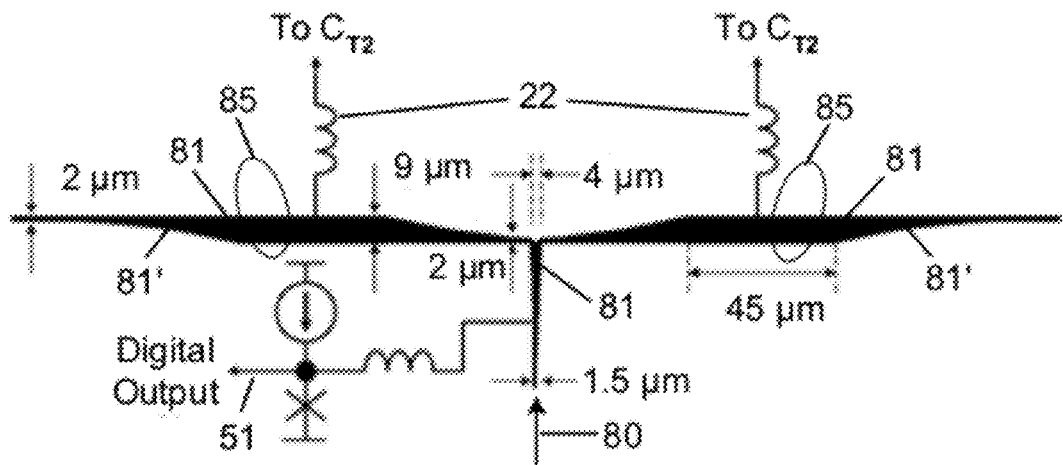
FIG. 2A shows a symbolic schematic/layout combination view of an embodiment of a long Josephson junction (LJJ) current amplifier.
Figure 2B:
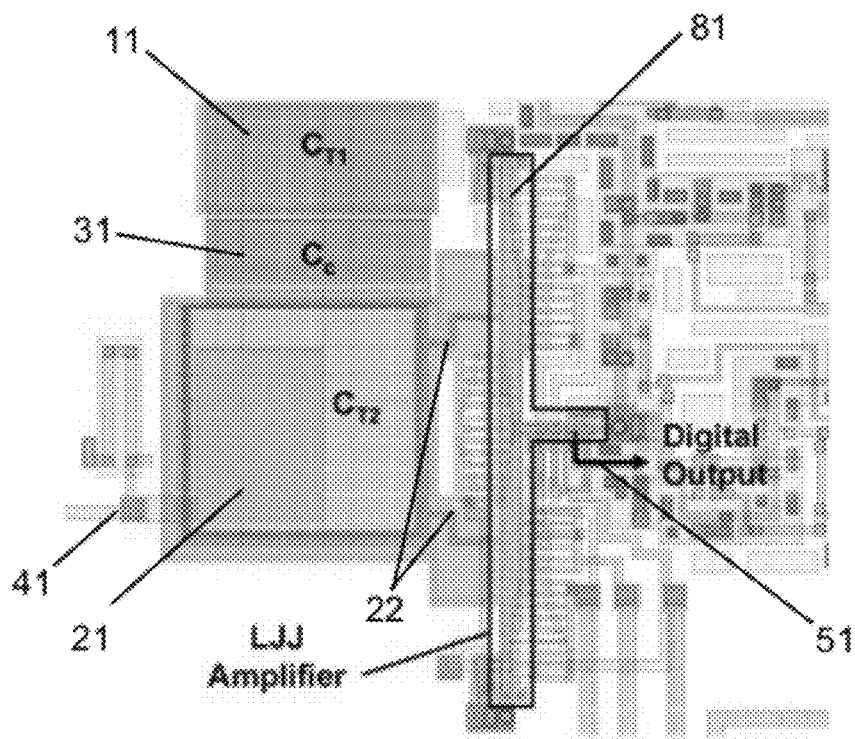
FIG. 2B shows a micrograph of a portion of an ADC chip.

FIG. 2A shows a symbolic schematic/layout combination view of an embodiment of an LJJ current amplifier. The LJJ 81 itself is presented in a layout view with its dimensions indicated. The dimensions are not intended to be limiting as they refer to a particular embodiment for a case where the Josephson penetration depth, ($\lambda_J$) is about 5.7 µm. Particular physical layouts of ADCs in embodiments of the present invention, for instance as shown in FIG. 2B, were exercised in a 1.5 µm groundrule Nb technology. In this technology the JJ critical current is about 4.5 kA/cm$^2$, resulting in the about 5.7 µm $\lambda_J$. In embodiments where $\lambda_J$ would take on different values, dimensions given in FIG. 2A may appropriately scale as well.

Using LJJs as amplifiers has been known in the art. Basically, the LJJ is current biased below, but near, its critical current. When the current of the input pulse arrives, the critical current of the LJJ is exceeded and the LJJ is triggered into its finite voltage state. The multiple, in a representative embodiment dual, arm 81' construction of the LJJ 81 serves the purpose of delivering a large current while significantly exceeding $\lambda_J$ in only one dimension. The shown two arm 81' construction should not be regarded as limiting, further arms 81', or just a single arm, may be used depending on need and on layout considerations.

The LJJ 81 amplifier is non-damped, and, as such, prone to unwanted oscillations, which would be detrimental to the modulator's 100 performance. The shape of the LJJ 81 and of its arms 81' evince considerations to avoid such unwanted oscillations. A maximum width value greater than about twice $\lambda_J$ would not result in further current gain, but also might degrade the LJJ amplifier performance. Due to similar considerations, the ends of the arms of the LJJ are tapered down to 2 µm, which may suppress reflections from those ends. This narrowing of the ends, together with the narrow input part, means that the LJJ 81 and/or its arms 81', have a varying width of a doubly tapered shape. In representative embodiments the tapering means that at a midsection region 85 is the LJJ 81, and/or its arms 81', the widest. As FIG. 2A shows, the input 80 is accepted at a location where the varying width of the LJJ is smaller than at the location where the LJJ has an amplified output entering the inductor 22.

Since the LJJ 81 in the embodiment shown in FIG. 2A has two arms, the inductor 22 of the second resonator 20 is also comprised of two separate members, as indicated in FIG. 2A. Both of the inductor 22 members then connect to the capacitor $C_{T2}$ 21 of the second resonator 20. Although LJJs are well known in the art, integrating an LJJ 81 into a circuit is a challenge that requires appropriate device matching, termination, and/or damping to facilitate the transmission of fluxons from an LJJ 81 to other devices in the circuit. For instance, this is evidenced in the design of the pulse output 51 port. The depiction of electrical elements in FIG. 1 and FIG. 2A, such as, for instance inductors, resistors, capacitors, JJs, follows the standard illustrations accepted in the art.

FIG. 2B shows a micrograph of a portion of a fabricated ADC chip, on which portion several components of the $\Sigma\Delta$ modulator 100 becomes visible. The indicator numbers of FIG. 2B correspond to those of FIG. 1. The capacitors of note discussed earlier, namely the coupling capacitor $C_c$ 31, and the resonator capacitors $C_{T1}$ 11 and $C_{T2}$ 21 are all marked. The capacitors are fabricated with differing dielectrics and dielectric thicknesses, consequently, their apparent size in the figure is not indicative of their capacitance value. The tapered LJJ amplifier 81 is also delineated for clarity. The inductor of the second resonator $L_{T2}$ 22 can be seen to have been fabricated in a novel two parallel segment manner, in order to interface with the two parallel outputs of the LJJ amplifier as shown in FIG. 2A. The point of the analog input 41, and where the oversampled single-bit data stream of the $\Sigma\Delta$ modulator 100 is outputted 51, are also shown. The ADC chip itself is fully superconducting, and besides the $\Sigma\Delta$ modulator 100, holds the electronics needed for outputting an 8 bit digital representation of an X-band incoming analog signal.

Specific values of the various components in the $\Sigma\Delta$ modulator 100 depend on particular implementation of an embodiment. Considerations entering the selection of component values may primarily be related to the signal frequency. Representative considerations and component values, with the understanding that no limitation on other selections is intended, may be given below for the case of an analog input signal in the 6 to 10 GHz range, with a modulation in the 500 MHz range. Digitization at these frequencies have been realized with chips as the one shown in FIG. 2B, and with selection of component values given as follows.

Input frequencies in the near 10 GHz range require a clock frequency for the $\Sigma\Delta$ modulator 100 in the 20 to 30 GHz range. As discussed earlier, a high $L_{T1}/L_{T2}$ ratio is desirable for effective isolation of the resonators. An $L_{T1}$ value above 100 pH may not desirable since it may lead to higher thermal/Johnson noise. Accordingly, a choice of about $L_{T1}$=90 pH, $L_{T2}$=4.5 pH yielding a $L_{T1}/L_{T2}$ ratio of 20 may be adequate. Then, resonant frequency considerations may require capacitance values of about $C_{T2}$=100 pF and $C_{T1}$=4 pF. For such resonator element values, a $C_{T2}/(C_{T1}+C_c) \approx 20$ selection for the coupling capacitor $C_c$ is preferred because it gives additional isolation to the resonators. This entails for $C_c$ to be about 1 pF, which also fulfills the desire that $C_c$ should be smaller than $C_{T1}$.

In the feedback path the input to the current amplification is a balanced comparator junction 83, which may have a critical current of about 200 μA. With the current requirement of the $L_{T2}$ 22 inductor being about 12 mA, a current amplification of about 60 needs to take place in the feedback loop 80. Using advanced sub-micron lithography for the superconducting circuits, the critical current of the junctions in the LJJ 81 may be sufficiently low that the LJJ 81, by itself, would be capable of the needed current amplification. Such a solution may be preferable, since as known in the art, the LJJ operates in so called non-damped mode, which makes its operation very fast. However, in alternate embodiments, for instance in the one displayed in FIG. 1, the LJJ 81 is preceded by a JTL 82, which provides preamplification. In a representative embodiment the JTL 82 may contain a few, maybe 2 to 6, gradually increasing JJs to drive the input of the LJJ 81.

Figure 3:
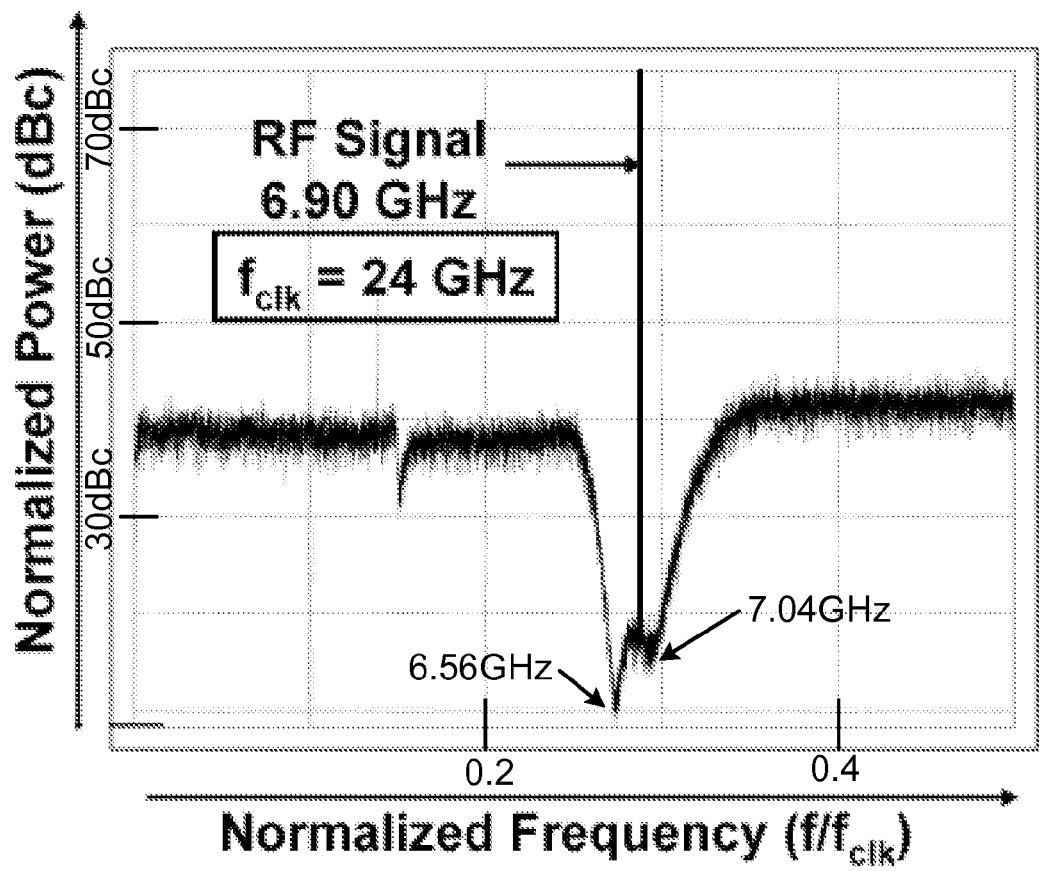
FIG. 3 shows a measured output power spectrum of a superconducting second order bandpass sigma-delta modulator according to an embodiment of the present invention.

FIG. 3 shows a measured output power spectrum of a superconducting second order bandpass sigma-delta modulator according to an embodiment of the present invention. The spectrum displayed in FIG. 3 was measured on a chip that is similar to the one which has a portion displayed in FIG. 2B.

The spectrum shows nulls at $f1_{null}$=7044 MHz, and $f2_{null}$=6562 MHz. For this measurement, the clock frequency was 24.0 GHz and the applied analog radio frequency (RF) input signal had a power level of −27 dBm at 6900 MHz. The measured signal-to-noise ratio (SNR) equals 5.16 bits=32.84 dB in the band between 6.48 GHz and 6.98 GHz.

The fabricated, see FIG. 2B, and measured, see FIG. 3, ADC circuit had a $Z_1/Z_2$, impedance ratio around 20. With higher impedance ratio the center frequency of the modulator sensitivity would increase. For an impedance ratio of about 50-100, a 500 MHz bandwidth signal could be sensitively detected with a central frequency of 7.5 GHz.

Figure 4:
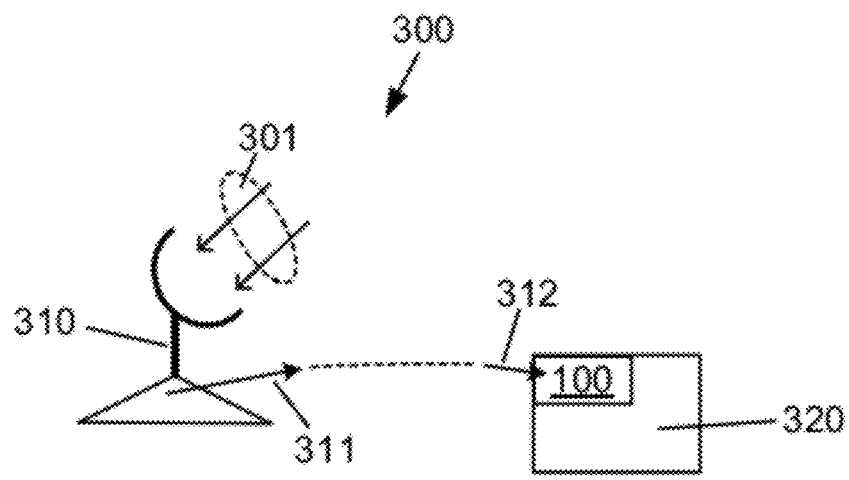
FIG. 4 symbolically shows a digital GHz radio frequency receiver system.

FIG. 4 symbolically shows a digital GHz radio frequency receiver system 300. Such systems may be used, without intent of limiting, in satellite communications. Typically a large parabolic antenna 310 receives a GHz frequency analog radio signal 301, and after possibly some amplification outputs the received analog signal 311, typically into a cable. This analog output 311 of the antenna 310 is the analog input 312 for a superconducting ADC chip 320, which contains an embodiment of the superconducting $\Sigma\Delta$ modulator 100 of the present disclosure. The superconducting ADC chip 320 then converts the received analog signal 322 into a digital output. The antenna typically is at room temperature, while the superconducting electronics 320 is typically cryocooled to an adequately low temperature for superconductor operation, which may be 4 to 5° K for the exemplary circuit shown in FIG. 2B.

Figure 5:
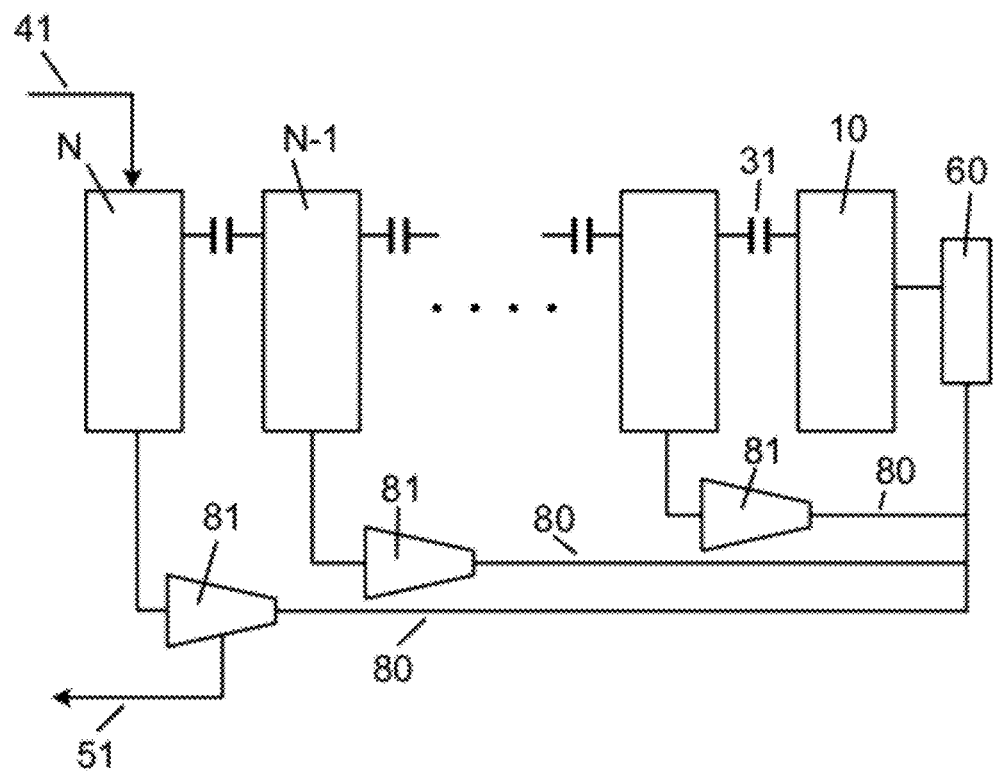
FIG. 5 shows a schematic block diagram of a superconducting multi-order bandpass sigma-delta modulator according to an embodiment of the present invention.

FIG. 5 shows a schematic block diagram of a superconducting multi-order bandpass sigma-delta modulator according to an embodiment of the present invention. The operation of the second order bandpass $\Sigma\Delta$ modulator may straightforwardly be extended to a multi-order bandpass $\Sigma\Delta$ modulator. The multi-order modulator has N resonators with N being at least 3. The resonators have desired impedance ratios and are pairwise coupled to each other typically by capacitors 31. The sequence of resonators has a first resonator 10, which connects to a comparator 60, which comparator generates single-flux-quantum (SFQ) pulses. The first resonator 10 has an implicit feedback loop due to the manner the comparator operates, while all the other stages have their own feedback loops 80. At least one of the feedback loops, but typically each of the feedback loops, of which there are at least two, comprises current amplification, which may be realized with LJJs 81. The analog input signal 41 is received by the last, or N-th, resonator, while the digital output signal 51, may be tapped off the feedback loop 80 linking to the last, or N-th, resonator, typically from the current amplifier 81.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A superconducting circuit, comprising:
   a first and a second resonator coupled to each other through a capacitor, wherein said first resonator and said second resonator have a desired impedance ratio;

a comparator connecting to said first resonator, wherein said comparator generates single-flux-quantum (SFQ) pulses;

a feedback loop receiving said SFQ pulses, wherein said feedback loop links to said second resonator, and said feedback loop comprises a current amplifier; and wherein said superconducting circuit is characterized as being a second order bandpass sigma-delta modulator.

2. The superconducting circuit of claim 1, wherein said current amplifier comprises a long Josephson Junction (LJJ).

3. The superconducting circuit of claim 2, wherein said LJJ has a shape of a varying width, and wherein said LJJ has input and output locations, and wherein said varying width is larger at said output location than at said input location.

4. The superconducting circuit of claim 2, wherein said LJJ has a plurality of arms.

5. The superconducting circuit of claim 1, wherein said superconducting circuit outputs a digital signal from said current amplifier.

6. The superconducting circuit of claim 1, wherein said desired impedance ratio is between 10 and 200.

7. The superconducting circuit of claim 6, wherein said desired impedance ratio is between 20 and 100.

8. The superconducting circuit of claim 1, wherein said superconducting circuit receives an analog input signal in said second resonator.

9. A method, comprising:
implementing a superconducting circuit, including:
coupling to each other a first and a second resonator through a capacitor, and selecting a desired impedance ratio between said first resonator and said second resonator;
connecting a comparator to said first resonator, wherein said comparator generates single-flux-quantum (SFQ) pulses;
receiving said SFQ pulses in a feedback loop, linking said feedback loop to said second resonator, and providing for current amplification in said feedback loop; and
wherein said method converts an analog electromagnetic signal into a digital signal, and said superconducting circuit is characterized as being a second order bandpass sigma-delta modulator.

10. The method of claim 9, wherein said method further comprises outputting said digital signal from said current amplifier.

11. The method of claim 9, wherein said providing for current amplification in said feedback loop includes the use of a long Josephson Junction (LJJ).

12. The method of claim 11, wherein said LJJ has input and output locations an has a varying width, said method further comprises selecting said varying width to be larger at said output location than at said input location.

13. The method of claim 11, wherein said method further comprises implementing said LJJ with multiple arms.

14. The method of claim 9, wherein said method further comprises receiving said analog electromagnetic signal in said second resonator.

15. The method of claim 9, wherein said method further comprises selecting said desired impedance ratio to be between 10 and 200.

16. The method of claim 15, wherein said method further comprises selecting said desired impedance ratio to be between 20 and 100.

17. A superconducting circuit, comprising:
a sequence of at least three resonators, wherein said resonators have desired impedance ratios and are pairwise coupled to each other through capacitors, and wherein said sequence has a first resonator;
a comparator connecting to said first resonator, wherein said comparator generates single-flux-quantum (SFQ) pulses;
feedback loops receiving said SFQ pulses, wherein said feedback loops link to at least two of said resonators, and wherein at least one of said feedback loops comprises a current amplifier; and
wherein said superconducting circuit is characterized as being a multiple order bandpass sigma-delta modulator.

18. A system, comprising:
a superconducting circuit characterized as being a second order bandpass sigma-delta modulator, wherein said superconducting circuit further comprises:
a first and a second resonator coupled to each other through a capacitor, wherein said first resonator and said second resonator have a desired impedance ratio;
a comparator connecting to said first resonator, wherein said comparator generates single-flux-quantum (SFQ) pulses;
a feedback loop receiving said SFQ pulses, wherein said feedback loop links to said second resonator, and said feedback loop comprises a current amplifier; and
wherein said system is characterized as being a digital RF receiver.

19. The system of claim 18, wherein said current amplifier comprises a long Josephson Junction (LJJ).

20. The system of claim 18, wherein said system further comprises an antenna configured to receive a GHz frequency radio transmission and to yield an analog output signal.

21. The system of claim 20, wherein said analog output signal is received by said superconducting circuit in said second resonator as an analog input signal.

22. The system of claim 21, wherein said superconducting circuit outputs a digital signal from said current amplifier.

* * * * *